(12) United States Patent
Shintani

(10) Patent No.: US 8,654,224 B2
(45) Date of Patent: Feb. 18, 2014

(54) COMPOSITE IMAGING ELEMENT AND IMAGING DEVICE EQUIPPED WITH SAME

(75) Inventor: Dai Shintani, Osaka (JP)

(73) Assignee: Panasonic Corporation, Osaka (JP)

( * ) Notice: Subject to any disclaimer, the term of this patent is extended or adjusted under 35 U.S.C. 154(b) by 353 days.

(21) Appl. No.: 13/098,485

(22) Filed: May 2, 2011

(65) Prior Publication Data

US 2011/0279716 A1 Nov. 17, 2011

(30) Foreign Application Priority Data

May 11, 2010 (JP) ................................ 2010-109023

(51) Int. Cl.
*H04N 9/083* (2006.01)
*G03B 13/00* (2006.01)

(52) U.S. Cl.
USPC ........................... 348/274; 348/275; 348/280

(58) Field of Classification Search
USPC .................. 348/274–275, 280, 310
See application file for complete search history.

(56) References Cited

U.S. PATENT DOCUMENTS

| | | | | |
|---|---|---|---|---|
| 5,965,875 | A * | 10/1999 | Merrill | 250/226 |
| 7,129,466 | B2 * | 10/2006 | Iwasaki | 250/214.1 |
| 7,728,904 | B2 * | 6/2010 | Quan et al. | 348/349 |
| 7,755,016 | B2 * | 7/2010 | Toda et al. | 250/208.1 |
| 8,076,746 | B2 * | 12/2011 | McCarten et al. | 257/447 |
| 8,094,208 | B2 * | 1/2012 | Myhrvold | 348/222.1 |
| 2006/0255417 | A1 * | 11/2006 | Kang | 257/432 |
| 2008/0230123 | A1 * | 9/2008 | Mitsui et al. | 136/263 |
| 2010/0157117 | A1 * | 6/2010 | Wang | 348/276 |

FOREIGN PATENT DOCUMENTS

| | | | |
|---|---|---|---|
| JP | 2004-165242 | A | 6/2004 |
| JP | 2005-252411 | A | 9/2005 |
| JP | 2005-353996 | A | 12/2005 |
| JP | 2008-227250 | A | 9/2008 |

\* cited by examiner

*Primary Examiner* — Ngoc-Yen Vu
(74) *Attorney, Agent, or Firm* — Shinjyu Global IP

(57) ABSTRACT

A composite imaging element is provided that includes a first imaging element and a second imaging element. The first imaging element has a plurality of first opto-electrical conversion parts, a first light receiving surface, and a first circuit part. The first opto-electrical conversion parts are configured to receive light with a first basic color and a second basic color different from the first basic color. The first opto-electrical conversion parts are also configured to convert light received by the first opto-electrical conversion parts into a first electrical signal. The first light receiving surface is formed by the first opto-electrical conversion parts. The first circuit part transmits the first electrical signal. The second imaging element has a plurality of second opto-electrical conversion parts and a second circuit part. The second opto-electrical conversion parts receive light emitted from the first opto-electrical conversion parts.

14 Claims, 6 Drawing Sheets

COMPOSITE IMAGING ELEMENT AND IMAGING DEVICE EQUIPPED WITH SAME

CROSS-REFERENCE TO RELATED APPLICATIONS

This application claims priority under 35 U.S.C. §119 to Japanese Patent Application No. 2010-109023, filed on May 11, 2010. The entire disclosure of Japanese Patent Applications No. 2010-109023 is hereby incorporated herein by reference.

BACKGROUND

1. Technical Field

The technology disclosed herein is related to a highly sensitive composite imaging element, and to an imaging device equipped with this composite imaging element.

2. Background Information

In the field of imaging devices, there are known imaging elements that convert light incident on a light receiving face (or surface) into an electrical signal by opto-electrical conversion, such as charge coupled device (CCD) type image sensors or complimentary metal oxide semiconductor (CMOS) type image sensors. These imaging elements are used in imaging devices such as digital cameras and digital video cameras to obtain a color image of a subject.

This imaging element has a multilayer structure formed by a semiconductor process over a silicon substrate. An opto-electrical conversion part that converts light into an electrical signal by opto-electrical conversion is formed over the silicon substrate. The opto-electrical conversion part is a photodiode or another such light receiving element. An insulating layer is formed over a silicon substrate on which an opto-electrical conversion part has been formed, and a circuit that transmits electrical signals and a mask that blocks light from being incident on the circuit are formed within this insulating layer. A color filter and a micro-lens are formed in that order of the insulating layer. The imaging element formed by this process is what is known as a front illumination type of imaging element, in which light that has passed through the insulating layer is incident on the opto-electrical conversion part.

The circuit formed at the imaging element is provided along the boundary of the opto-electrical conversion part, and is formed fine so that the light receiving surface area of the light receiving element can be as wide as possible. However, some of the light will be blocked by the mask, so in actual practice the proportion of the total surface area of the light receiving element accounted for by the opto-electrical conversion part (the open ratio) will be about 60% at best.

Meanwhile, better image quality is needed in the field of imaging devices, and the trend is for the number of pixels of an imaging element to increase. If the pixel count is increased without changing the size of the imaging element, the surface area per opto-electrical conversion part will decrease, so the sensitivity of the imaging element ends up being lower than when there are fewer pixels.

In addition to the above-mentioned front illumination type of imaging elements, so-called back illumination imaging elements have also been proposed (see Japanese Laid-Open Patent Application 2005-353996, for example). In the process of manufacturing a back illumination imaging element, an opto-electrical conversion part and an insulating layer are formed in that order on a silicon substrate. The silicon substrate is then removed to form a light receiving face. With a back illumination imaging element, the incident light reaches the opto-electrical conversion part without being blocked by a circuit, so the opto-electrical conversion by the opto-electrical conversion part is more efficient. Thus, using a back illumination imaging element allows the sensitivity of an imaging element to be increased somewhat. With the back illumination imaging element disclosed in Japanese Laid-Open Patent Application 2005-353996, a color filter is disposed on the light receiving face side in order to obtain a color image. A silicon dioxide layer is formed as a protective film between the color filter and the opto-electrical conversion part in order to protect the opto-electrical conversion part.

A technique whereby a plurality of imaging elements are superposed has been proposed in an effort to subject light to opto-electrical conversion more efficiently (see Japanese Laid-Open Patent Application 2005-252411 or Japanese Laid-Open Patent Application 2008-227250, for example). Light is incident on the plurality of imaging elements, and each of these imaging elements performs opto-electrical conversion, allowing the light to be utilized more efficiently. The solid state imaging device disclosed in Japanese Laid-Open Patent Application 2005-252411 has a first imaging element and a second imaging element provided with a color filter. With this solid state imaging device, the first imaging element is affixed on the color filter side of the second imaging element. The composite solid state imaging device disclosed in Japanese Laid-Open Patent Application 2008-227250 has a first imaging element provided with a color filter, and a second imaging element. With this composite imaging element, the second imaging element is superposed via a spacer on the opposite side of the first imaging element from the color filter.

However, when a plurality of imaging elements are affixed with their positions staggered, as with the solid state imaging device disclosed in Japanese Laid-Open Patent Application 2005-252411, light is blocked by the circuit provided to the first imaging element, and it is possible that the second imaging element will not receive enough light. Thus, with a composite imaging element in which a plurality of imaging elements are superposed, there is the risk that high sensitivity will not be obtained, depending on the layout of the imaging elements.

Also, with the composite solid state imaging element disclosed in Japanese Laid-Open Patent Application 2008-227250, the light is attenuated as it passes through the color filter provided to the first imaging element, so even though a plurality of imaging elements are used, there is the risk that sensitivity will still be inadequate.

SUMMARY

In accordance with one aspect of the technology disclosed herein, a composite imaging element is provided that includes a first imaging element and a second imaging element. The first imaging element has a plurality of first opto-electrical conversion parts, a first light receiving surface, and a first circuit part. The first opto-electrical conversion parts are configured to receive light with a first basic color and a second basic color different from the first basic color. The first opto-electrical conversion parts are also configured to convert light received by the first opto-electrical conversion parts into a first electrical signal. The first light receiving surface is formed by the first opto-electrical conversion parts. The first circuit part transmits the first electrical signal. The second imaging element has a plurality of second opto-electrical conversion parts and a second circuit part. The second opto-electrical conversion parts receive light emitted from the first opto-electrical conversion parts and convert light received by the second opto-electrical conversion parts into a second electrical signal. The second circuit part is disposed at a position that overlaps the first circuit part when viewed in a first direction substantially perpendicular to the first light receiving surface. The second electrical signal is transmitted through the second circuit part.

These and other objects, features, aspects and advantages of the technology disclosed herein will become apparent to those skilled in the art from the following detailed description, which, taken in conjunction with the annexed drawings, discloses embodiments of the present invention.

BRIEF DESCRIPTION OF DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

First Embodiment 1.1: Constitution of Imaging Device

Figure 1:
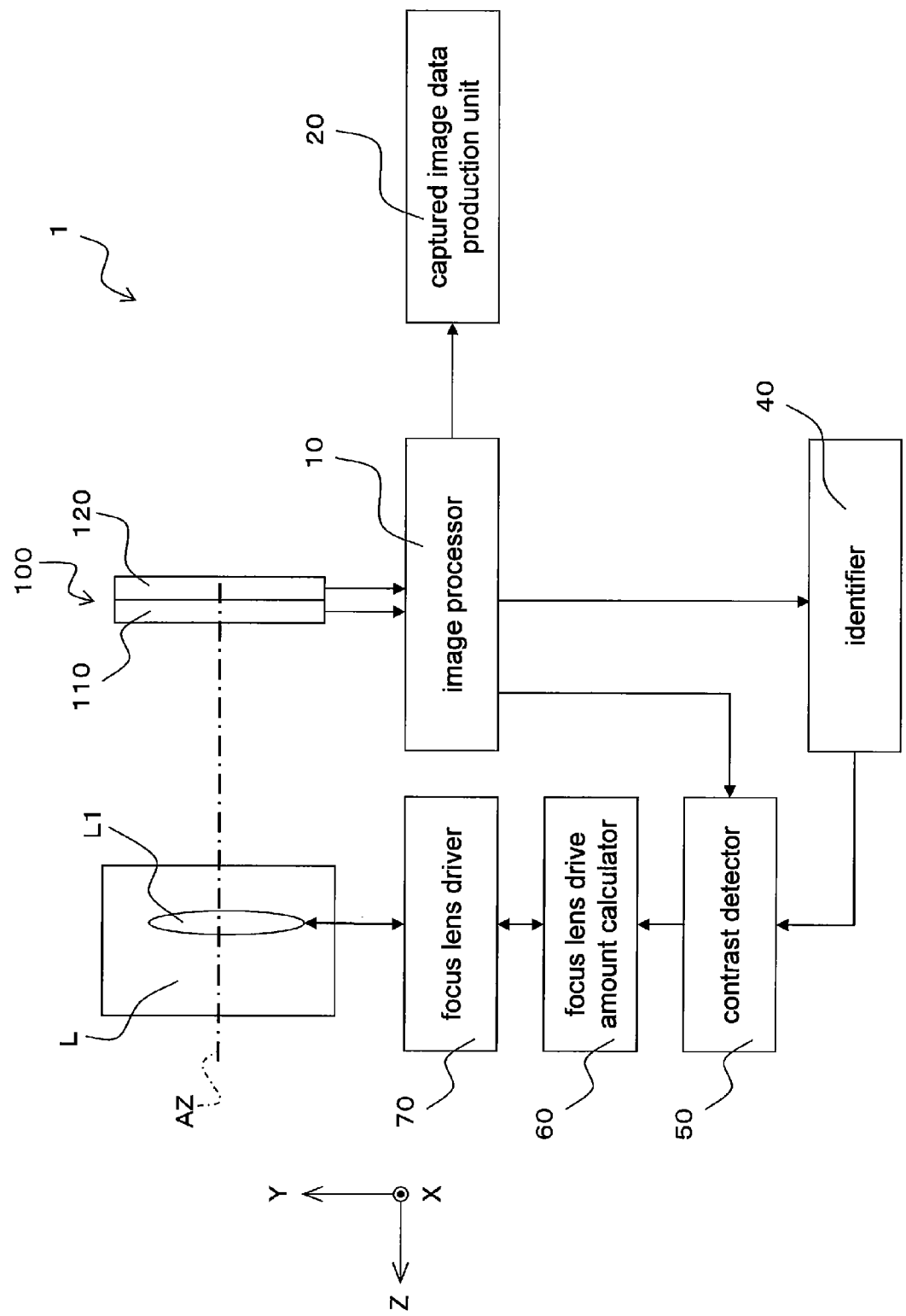
FIG. 1 is a simplified diagram of the constitution of an imaging device 1.

FIG. 1 is a simplified diagram of the constitution of an imaging device 1 according to an embodiment. The imaging device 1 is a device for capturing and acquiring an image of a subject. An image that has been captured will hereinafter be referred to as a captured image.

As shown in FIG. 1, the imaging device 1 mainly comprises an optical system L, a composite imaging element 100, an image processor 10, a captured image data production unit 20, an identifier 40, a contrast detector 50, a focus lens drive amount calculator 60, and a focus lens driver 70.

1.1.1: Optical System

The optical system L collects light from a subject and forms an optical image of the subject. The optical system L mainly has a zoom lens (not shown) for adjusting the focal length, and a focus lens L1. When the position of the focus lens L1 is adjusted, the optical image of the subject is formed in a state of being focused on a first light receiving face (or surface) 112a (discussed below) (hereinafter referred to as a focused state).

The optical system L has an optical axis AZ. The optical system L emits collected light in a direction that is parallel to the optical axis AZ (hereinafter referred to as the optical axis AZ direction). The optical axis AZ direction is substantially perpendicular to the first light receiving face 112a of a first imaging element 110.

The focus lens L1 is driven by the focus lens driver 70 (discussed below), and the position of the focus lens L1 in the optical axis AZ direction is adjusted so that the optical system L is in a focused state.

1.1.2: Composite Imaging Element

Figure 2:
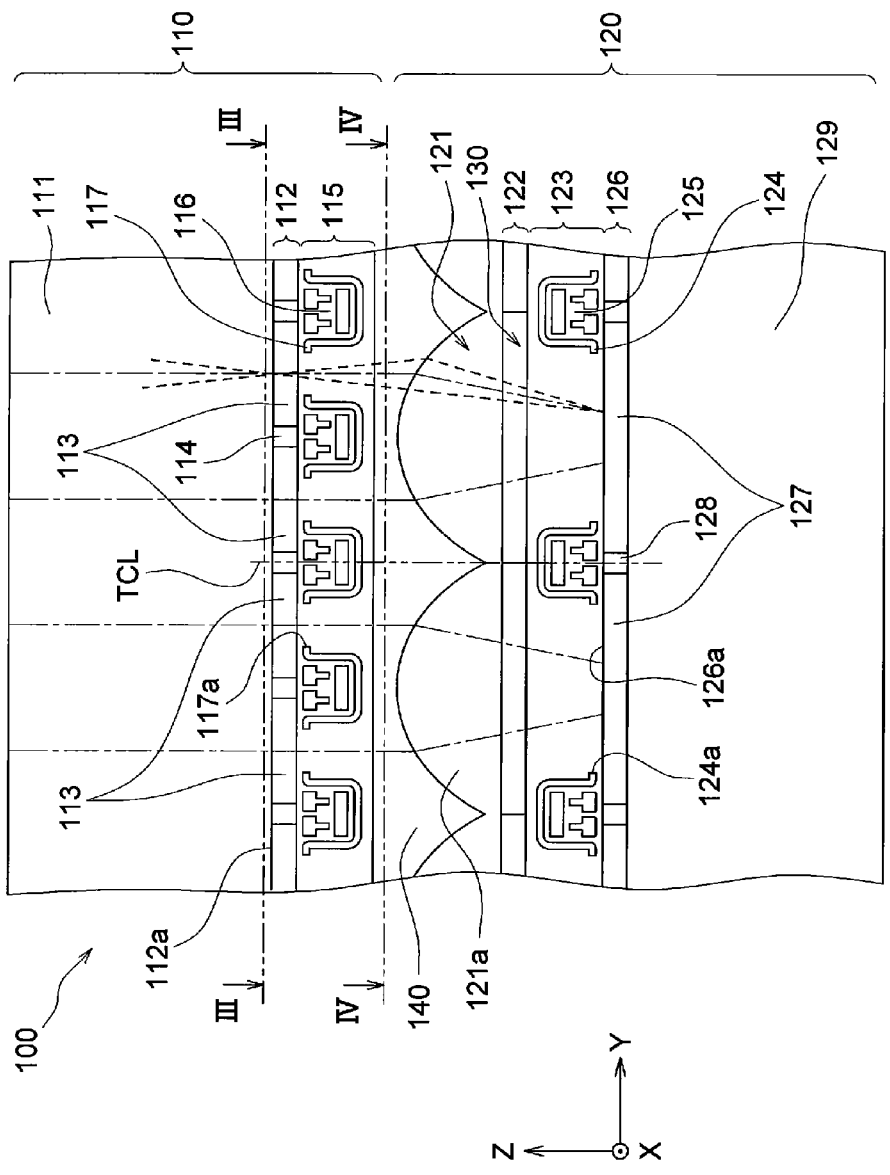
FIG. 2 is a partial vertical cross section of a composite imaging element 100.
Figure 3:
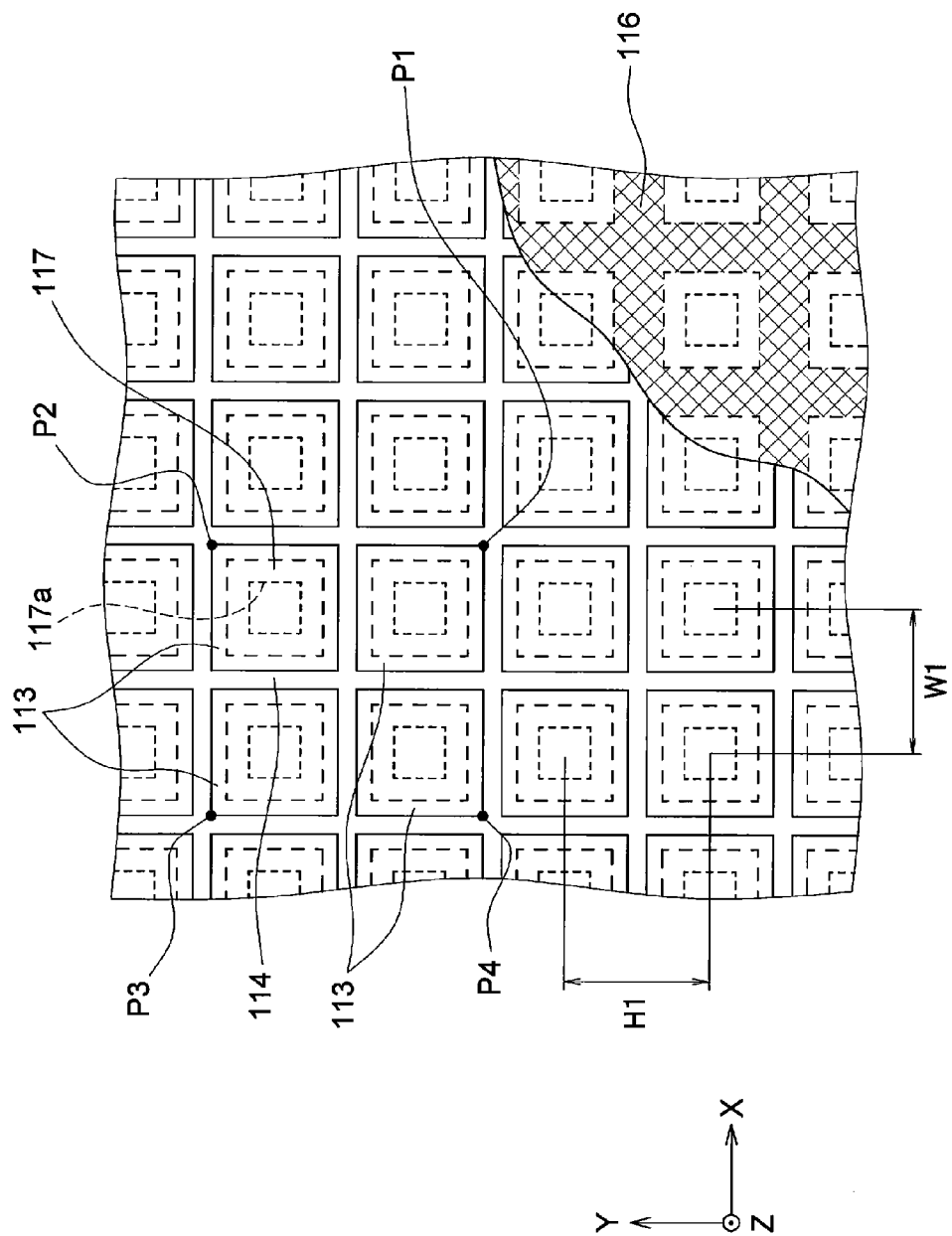
FIG. 3 is a partial cross section along the line in FIG. 1.
Figure 4:
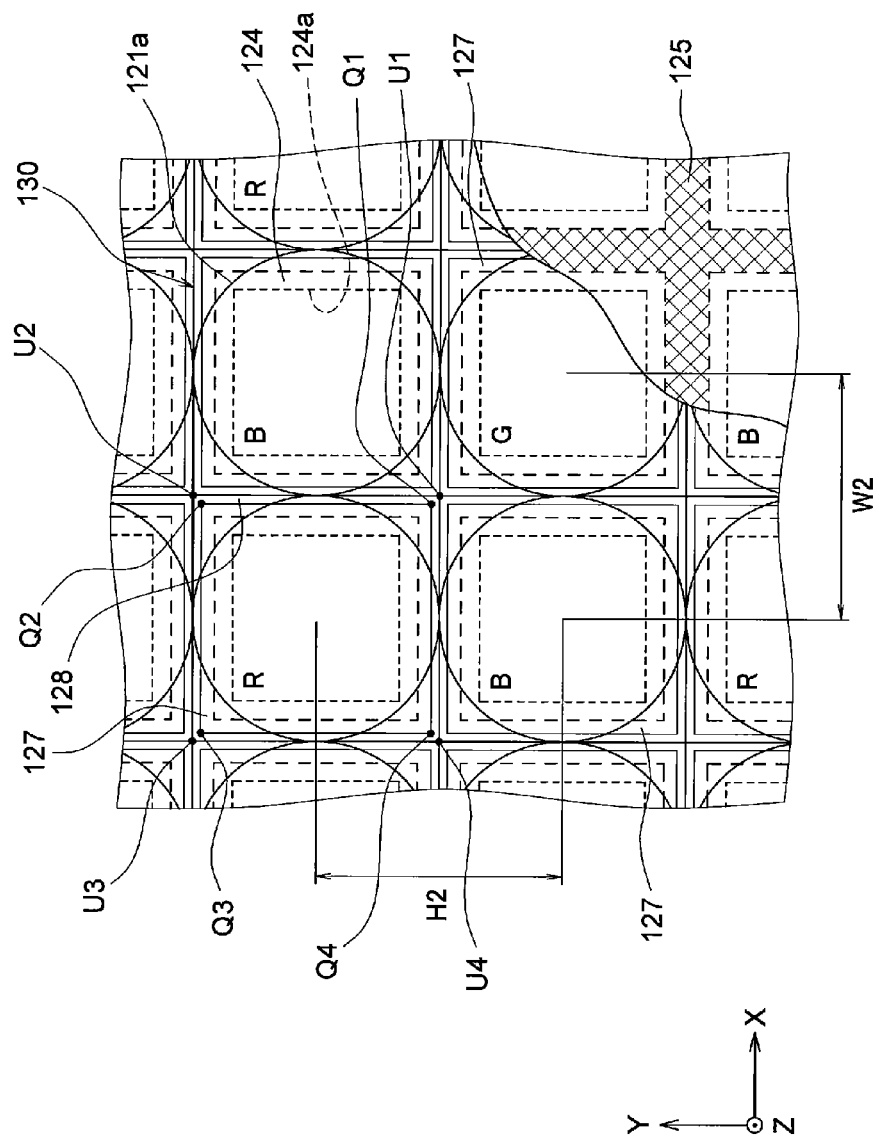
FIG. 4 is a partial cross section along the IV-IV line in FIG. 1.
Figure 5:
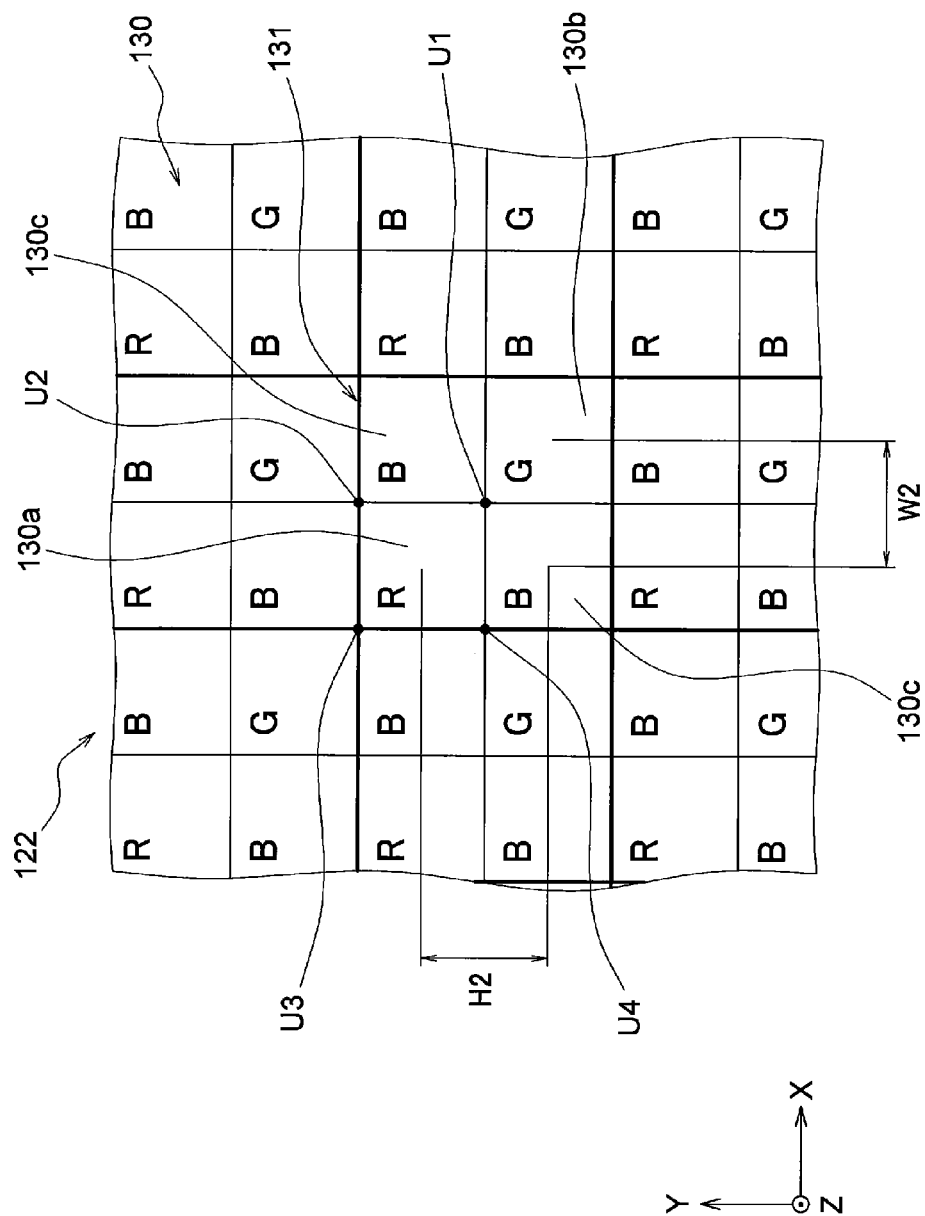
FIG. 5 is a plan view of color filters 130.

The composite imaging element 100 will be described through reference to the drawings. FIG. 2 is a partial cross section of the composite imaging element 100 according to this embodiment. FIGS. 3 and 4 are partial cross sections of the composite imaging element 100 shown in FIG. 2. FIG. 5 is a partial plan view of color filters 130. In FIGS. 2 to 5, a three-dimensionally perpendicular coordinate system O is introduced so that the optical axis AZ direction coincides with the Z axis direction. In FIG. 1, the three-dimensionally perpendicular coordinate system O is introduced with respect to the optical system L and the composite imaging element 100, and the direction facing the composite imaging element 100 from the optical system L coincides with the Z axis negative direction.

The composite imaging element 100 receives the light collected by the optical system L and converts this light into an electrical signal. The composite imaging element 100 comprises the first imaging element 110 and a second imaging element 120 that is superposed with the first imaging element 110 via an adhesive layer 140 in the optical axis AZ direction.

First Imaging Element

As shown in FIG. 2, the first imaging element 110 has reinforcing glass 111, a first semiconductor layer 112, a first insulating layer 115, a first circuit part 116, and a first mask 117. The first imaging element 110 has a multilayer structure, and the reinforcing glass 111, the first semiconductor layer 112, and the first insulating layer 115 are formed in that order in the optical axis AZ direction as viewed from the optical system L. In this embodiment, the first imaging element 110 is a CMOS type of image sensor.

The reinforcing glass 111 is a glass substrate, and forms the surface of the composite imaging element 100 on the optical system L side. The reinforcing glass 111 ensures the strength of the first imaging element 110, and is fixed by adhesive bonding, for example, to the first light receiving face 112a of the first semiconductor layer 112.

The reinforcing glass 111 is a transparent member with respect to at least the wavelength band of visible light, and guides visible light that is incident on the reinforcing glass 111 to the first light receiving face 112a. The concept of "transparent with respect to visible light" here means that the material has no property of blocking light of a specific wavelength band included in visible light. For example, it refers to the property of being able to transmit light of all three primary colors. In other words, with the first imaging element 110, when the three primary colors of light are red (one example of a first basic color, and one example of a second basic color), green (an example of a first basic color, and an example of a second basic color), and blue (one example of a first basic color, and one example of a second basic color), the light can be incident on the first light receiving face 112a regardless of which color it corresponds to.

The term "basic color" here means a color component that serves as a basis for expressing color. Color is expressed by mixing several basic colors in a specific ratio. For instance, the term basic color refers to red, green, or blue in the three primary colors of light.

Thus, with the first imaging element 110, no color filter is provided, and a top layer that is transparent to at least visible light (that is, the reinforcing glass 111) is provided between first opto-electrical conversion parts 113 from the surface on the optical system L side. Therefore, light that includes at least two different basic colors can be incident on the first opto-electrical conversion parts 113.

The first semiconductor layer 112 is a thin-film disposed between the reinforcing glass 111 and the first insulating layer 115, and has the first opto-electrical conversion parts 113 and first separation regions 114. An n-type semiconductor, p-type semiconductor, or the like is formed by a semiconductor process at the first semiconductor layer 112.

The first opto-electrical conversion parts 113 are pixels of the first imaging element 110, and convert received light into an electrical signal. Photodiodes are used, for example, as the first opto-electrical conversion parts 113. A typical photodiode has a structure in which a p-type semiconductor film (not shown) is formed over a region (not shown) formed by an n-type semiconductor. In this case, the regions of the first imaging element 110 accounted for by the first opto-electrical conversion parts 113 are regions where an n-type semiconductor and p-type semiconductor are formed as photodiodes.

As shown in FIG. 3, the plurality of first opto-electrical conversion parts 113, which are all the same size, are disposed in a matrix, and form the first light receiving face 112a. The first light receiving face 112a is the boundary of the first semiconductor layer 112 on the reinforcing glass 111 side. The first light receiving face 112a can receive light incident on the first imaging element 110. As discussed above, the positional relation between the optical system L and the composite imaging element 100 is decided so that the optical axis AZ direction (an example of a first direction) and the first light receiving face 112a are substantially perpendicular.

The first opto-electrical conversion parts 113 are arranged in a regular pattern along the first light receiving face 112a. As shown in FIG. 3, the first opto-electrical conversion parts 113 are arranged equidistantly at a first lateral spacing W1 (an example of a first pitch) in the X axis direction, and are arranged equidistantly at a first vertical spacing H1 (an example of a first pitch) in the Y axis direction. The first lateral spacing W1 here is the distance between the centers of adjacent first opto-electrical conversion parts 113 in the X axis direction, and the first vertical spacing H1 is the distance between the centers of adjacent first opto-electrical conversion parts 113 in the Y axis direction. Thus, the first opto-electrical conversion parts 113 are arranged at a constant first pitch (namely, the first lateral spacing W1 and the first vertical spacing H1) in the X axis direction and the Y axis direction.

The first separation regions 114 are provided between the first opto-electrical conversion parts 113, and form the boundaries between adjacent first opto-electrical conversion parts 113. As shown in FIG. 3, the first separation regions 114 are provided in a lattice pattern in a direction parallel to the first light receiving face 112a.

The same semiconductor process as that used for the first opto-electrical conversion parts 113 can be used to form the first separation regions 114. The structure of the semiconductor layer formed in the first separation regions 114 differs from the structure of the semiconductor layer formed in the first opto-electrical conversion parts 113, so the electrical signal generated by a first opto-electrical conversion part 113 is not transmitted to adjacent first opto-electrical conversion parts 113. The first separation regions 114 separate the first opto-electrical conversion parts 113.

The first insulating layer 115 is formed on the opposite side of the first semiconductor layer 112 from the reinforcing glass 111. The first circuit part 116 and the first mask 117 are formed in the first insulating layer 115. The first insulating layer 115 is formed from silicon dioxide, for example, and covers the first circuit part 116 and the first mask 117.

The first circuit part 116 has a signal line, transistor, or other such circuit for transmitting electrical signals generated by the first opto-electrical conversion parts 113, and is formed inside the first insulating layer 115. The first circuit part 116 is connected to a peripheral circuit (not shown). The electrical signals generated by the first opto-electrical conversion parts 113 are read into the image processor 10 (discussed below) via the first circuit part 116 and the peripheral circuit.

As shown in FIG. 3, the first circuit part 116 is formed in a lattice pattern inside the first insulating layer 115. In FIG. 3, part of the first semiconductor layer 112 is not shown, and the first circuit part 116 is indicated by cross-hatching. The first circuit part 116 is disposed at a position that overlaps the first separation regions 114 when viewed in the optical axis AZ direction. In other words, the position of the boundaries between the first opto-electrical conversion parts 113 when viewed in the optical axis AZ direction overlaps the position of the first circuit part 116.

The first mask 117 is a thin-film formed from tungsten or another such metal, for example, and is formed so as to cover the opposite side of the first circuit part 116 from the first semiconductor layer 112. The first mask 117 blocks at least visible light.

The first mask 117 has first openings 117a formed at positions corresponding to the first opto-electrical conversion parts 113. More specifically, the first openings 117a are opposite the first opto-electrical conversion parts 113 in the optical axis AZ direction. Also, as shown in FIG. 3, the first openings 117a overlap the first opto-electrical conversion parts 113 when viewed in the optical axis AZ direction. The first openings 117a transmit part of the light incident on the first insulating layer 115, and send it to the second imaging element 120.

As discussed above, with the first imaging element 110, the first insulating layer 115 in which the first circuit part 116 is formed is provided on the opposite side of the first opto-electrical conversion parts 113 from the first light receiving face 112a. Specifically, the first imaging element 110 is what is known as a back illumination type of imaging element. Thus, with the first imaging element 110, light incident on the first imaging element 110 can be directly incident on the first opto-electrical conversion parts 113, without passing through the first insulating layer 115. As a result, more light is incident on the first opto-electrical conversion parts 113, and the sensitivity of the first imaging element 110 is improved.

Second Imaging Element

As shown in FIG. 2, the second imaging element 120 has a micro-lens 121, a color filter layer 122, a second insulating layer 123, a second mask 124, a second circuit part 125, a second semiconductor layer 126, and a silicon substrate 129. The second imaging element 120 has a multilayer structure, in which the silicon substrate 129, the second semiconductor layer 126, the second insulating layer 123, the color filter layer 122, and the micro-lens 121 are formed in that order in the optical axis AZ direction when viewed from the opposite side from the optical system L. In this embodiment, the second imaging element 120 is a CCD type of image sensor.

The silicon substrate 129 is a substrate used in the semiconductor process of forming the second imaging element 120, and the second semiconductor layer 126 is formed over the silicon substrate 129. The silicon substrate 129 ensures the strength of the second imaging element 120.

The second semiconductor layer 126 is a thin-film formed over the silicon substrate 129, and has second opto-electrical conversion parts 127 and second separation regions 128. An n-type semiconductor, p-type semiconductor, or the like is formed by a semiconductor process at the second semiconductor layer 126.

The second opto-electrical conversion parts 127 are pixels of the second imaging element 120, and convert received light into an electrical signal. Photodiodes are used, for example, as the second opto-electrical conversion parts 127. A typical photodiode has a structure in which a p-type semiconductor film (not shown) is formed over a region (not shown) formed by an n-type semiconductor. In this case, the regions of the second imaging element 120 accounted for by the second opto-electrical conversion parts 127 are regions where an n-type semiconductor and p-type semiconductor are formed as photodiodes.

As shown in FIG. 3, the plurality of second opto-electrical conversion parts 127 are disposed in a matrix, and form a second light receiving face (or surface) 126*a* that is parallel to the first light receiving face 112*a*. The second light receiving face 126*a* is formed on the opposite side of the second semiconductor layer 126 from the silicon substrate 129, and can receive light that is incident on the second imaging element 120.

The second opto-electrical conversion parts 127 are arranged in a regular pattern along the second light receiving face 126*a*. As shown in FIG. 4, the second opto-electrical conversion parts 127 are arranged equidistantly at a second lateral spacing W2 (an example of a second pitch) in the X axis direction, and are arranged equidistantly at a second vertical spacing H2 (an example of a second pitch) in the Y axis direction. The second lateral spacing W2 here is the distance between the centers of adjacent second opto-electrical conversion parts 127 in the X axis direction, and the second vertical spacing H2 is the distance between the centers of adjacent second opto-electrical conversion parts 127 in the Y axis direction. Thus, the second opto-electrical conversion parts 127 are arranged at a constant second pitch (namely, the second lateral spacing W2 and the second vertical spacing H2) in the X axis direction and the Y axis direction.

The second pitch is greater than the first pitch at which the first opto-electrical conversion parts 113 are arranged. More specifically, the second pitch is twice the first pitch. More precisely, the second lateral spacing W2 is twice the first lateral spacing W1, and the second vertical spacing H2 is twice the first vertical spacing H1.

The second opto-electrical conversion parts 127 overlap four of the first opto-electrical conversion parts 113 when viewed in the optical axis AZ direction. More specifically, as shown in FIGS. 3 and 4, when viewed in the optical axis AZ direction, the square region obtained by linking points Q1 to Q4 overlaps the square region obtained by linking points P1 to P4. That is, when viewed in the optical axis AZ direction, the points Q1 to Q4 substantially overlap the points P1 to P4. Here, the square obtained by linking points Q1 to Q4 coincides with the outer periphery of one of the second opto-electrical conversion parts 127 when viewed in the optical axis AZ direction. Also, four of the first opto-electrical conversion parts 113 are disposed aligned in two rows in the X axis direction and the Y axis direction on the inside of the square obtained by linking the points P1 to P4.

As discussed above, one of the second opto-electrical conversion parts 127 is disposed at a position overlapping four corresponding first opto-electrical conversion parts 113. Also, when viewed in the optical axis AZ direction, one of the first opto-electrical conversion parts 113 overlapping any two adjacent second opto-electrical conversion parts 127, the first opto-electrical conversion part 113 that overlaps one of the second opto-electrical conversion parts 127 does not overlap the other second opto-electrical conversion part 127.

The second separation regions 128 are provided between the second opto-electrical conversion parts 127, and form the boundaries between adjacent second opto-electrical conversion parts 127. As shown in FIG. 4, the second separation regions 128 are provided in a lattice pattern in a direction parallel to the second light receiving face 126*a*.

The same semiconductor process as that used for the second opto-electrical conversion parts 127 can be used to form the second separation regions 128. The structure of the semiconductor layer formed in the second separation regions 128 differs from the structure of the semiconductor layer formed in the second opto-electrical conversion parts 127, so the electrical signal generated by a second opto-electrical conversion part 127 is not transmitted to adjacent second opto-electrical conversion parts 127. The second separation regions 128 separate the second opto-electrical conversion parts 127.

The second separation regions 128 are disposed at positions corresponding to the first separation regions 114 of the first imaging element 110. That is, as shown by the two-dot chain line TCL drawn parallel to the optical axis AZ direction in FIG. 2, the center positions of the second separation regions 128 substantially coincide with the center positions of the first separation regions 114 when viewed in the optical axis AZ direction.

The second insulating layer 123 is formed on the opposite side of the second semiconductor layer 126 from the silicon substrate 129. The second circuit part 125 and the second mask 124 are formed at the second insulating layer 123. The second insulating layer 123 is formed from silicon dioxide, for example, and covers the second circuit part 125 and the second mask 124.

The second circuit part 125 has a vertical register, a charge transmission path, or another such circuit for transmitting the electrical signals generated by the second opto-electrical conversion parts 127, and is formed inside the second insulating layer 123. The second circuit part 125 is connected to a peripheral circuit (not shown). The electrical signals generated by the second opto-electrical conversion parts 127 are read into the image processor 10 via the second circuit part 125 and the peripheral circuit.

As shown in FIG. 4, the second circuit part 125 is formed in a lattice pattern inside the second insulating layer 123. In FIG. 4, part of the micro-lens 121 and the color filter layer 122 is not shown, and the second circuit part 125 is indicated by cross-hatching. The second circuit part 125 is disposed at a position that overlaps the second separation regions 128 when viewed in the optical axis AZ direction. In other words, the position of the boundaries between the second opto-electrical conversion parts 127 when viewed in the optical axis AZ direction overlaps the position of the second circuit part 125.

Also, as shown by the two-dot chain line TCL drawn parallel to the optical axis AZ direction in FIG. 2, the second circuit part 125 is disposed at a position that overlaps the first circuit part 116 when viewed in the optical axis AZ direction. In other words, the first circuit part 116 and the second circuit part 125 are disposed so as to avoid the optical path taken by light heading from the first opto-electrical conversion parts 113 to the second opto-electrical conversion parts 127. As a result, the second imaging element 120 can receive more light, so the sensitivity of the second imaging element 120 is improved.

The second mask 124 is a thin-film formed from tungsten or another such metal, for example, and is formed so as to cover the opposite side of the second circuit part 125 from the second semiconductor layer 126. The second mask 124 blocks out at least visible light. Light that passes through the first imaging element 110 and is incident on the second insulating layer 123 is blocked by the second mask 124, so it cannot be directly incident on the second circuit part 125. Particularly when the second imaging element 120 is a CCD type, if light hits the second circuit part 125, it can cause the generation of unnecessary electrical signals that become the source of smearing and so forth, but the second mask 124 reduces the generation of these unnecessary electrical signals.

The second mask 124 has second openings 124a formed at a position corresponding to the second opto-electrical conversion parts 127. More specifically, the second openings 124a are opposite the second opto-electrical conversion parts 127 in the optical axis AZ direction. Also, as shown in FIG. 4, the second openings 124a overlap the second opto-electrical conversion parts 127 when viewed in the optical axis AZ direction. The second openings 124a transmit light that is incident on the second insulating layer 123, and send it to the second opto-electrical conversion parts 127.

The color filter layer 122 is a thin-film in which the color filters 130 are formed, and is formed on the opposite side of the second insulating layer 123 from the second semiconductor layer 126. The color filter layer 122 could also be said to be disposed between the first opto-electrical conversion parts 113 and the second opto-electrical conversion parts 127. The color filters 130 are formed in the color filter layer 122, and is an optical element that changes the wavelength band by transmitting light.

As shown in FIG. 5, the shape of the various filters included in the color filters 130 is square when viewed in the optical axis AZ direction. For example, a square obtained by linking points U1 to U4 coincides with the outer edges of the filters included in the color filters 130 (more precisely, first filters 130a) when viewed in the optical axis AZ direction.

The color filters 130 include a plurality of first filters 130a, a plurality of second filters 130b, and a plurality of third filters 130c. The first filters 130a are filters whose transmissivity of the red visible light wavelength band (an example of a first wavelength band) is higher than that of visible light wavelength bands of colors other than red. The second filters 130b are filters whose transmissivity of the green visible light wavelength band (an example of a second wavelength band) is higher than that of visible light wavelength bands of colors other than green. The third filters 130c are filters whose transmissivity of the blue visible light wavelength band (an example of a third wavelength band) is higher than that of visible light wavelength bands of colors other than blue.

In FIGS. 4 and 5, the letters R (red), G (green), and B (blue) are added to indicate the colors of the various color filters 130. R, and B are abbreviations used in the RGB color model, and represent red, green, and blue, respectively.

The color filters 130 are disposed regularly in a direction perpendicular to the optical axis AZ direction (that is, parallel to the first light receiving face 112a). In this embodiment, one filter is disposed at a position corresponding to one second opto-electrical conversion part 127. More specifically, the filters that make up the color filters 130 are arranged at a second pitch in the X axis direction and the Y axis direction (that is, the second lateral spacing W2 and the second vertical spacing H2), just as are the second opto-electrical conversion parts 127. Furthermore, when viewed in the optical axis AZ direction, one of the filters that make up the color filters 130 is disposed at a position overlapping one of the second opto-electrical conversion parts 127. For example, as shown in FIGS. 4 and 5, when viewed in the Z axis direction, one of the second opto-electrical conversion parts 127 whose outer edges are a square obtained by linking the points Q1 to Q4 is included inside the first filter 130a whose edges are a square obtained by linking the points U1 to U4.

The color filters 130 are arranged so as to form a repeating pattern. Pattern elements 131 are the basic unit of the repeating pattern of the color filters 130. When viewed in the Z axis direction, the pattern elements 131 are aligned in the X axis direction and the Y axis direction.

The pattern elements 131 include one first filter 130a, one second filter 130b, and two third filters 130c. Also, with the pattern elements 131, the filters are arranged in two rows in the X axis direction and the Y axis direction. More specifically, in the row on the Y axis direction negative side, a blue (B in FIG. 5) third filter 130c is disposed on the X axis negative side, and a green (G in FIG. 5) second filter 130b is disposed on the X axis positive side. In the row on the Y axis direction positive side, a red (R in FIG. 5) first filter 130a is disposed on the X axis negative side, and a blue third filter 130c is disposed on the X axis positive side. Thus, the color filters 130 are arranged so that the ratio of the number of first filters 130a to the number of second filters 130b to the number of third filters 130c is 1:1:2.

As discussed above, the layout of the color filters 130 is an RGBB type of arrangement in which a green (G) is switched for a blue (B) in a so-called RGGB Bayer arrangement.

The micro-lens 121 (an example of a light collector) is an optical element disposed on the opposite side of the color filters 130 from the second insulating layer 123, and focuses the light emitted by the first imaging element 110 on the second opto-electrical conversion parts 127. The micro-lens 121 has a plurality of lens elements 121a corresponding to the first filters 130a, the second filters 130b, and the third filters 130c. As shown in FIGS. 2 and 4, the lens elements 121a are provided at positions overlapping the second opto-electrical conversion parts 127 when viewed in the optical axis AZ direction, and are formed one for each of the second opto-electrical conversion parts 127. A convex surface is formed on the first imaging element 110 side (that is, the opposite side from the color filters 130) of the micro-lens 121. The convex surface-side of the micro-lens 121 is bonded to the first insulating layer 115 of the first imaging element 110 by the adhesive layer 140. Therefore, the micro-lens 121 could also be said to be disposed between the first opto-electrical conversion parts 113 and the second opto-electrical conversion parts 127.

1.1.3: Constitution Related to Signal Processing

The image processor 10 (one example of a first (or brightness) signal acquisition unit and one example of a second (or color component) signal acquisition unit) subjects the electrical signal produced by the composite imaging element 100 to specific processing to produce first image data and second image data. The image processor 10 also has the function of producing an L component signal and an ab component signal for the Lab color space from the first image data and the second image data.

The image processor 10 reads first electrical signals produced by the first opto-electrical conversion parts 113 via the first circuit part 116 and the peripheral circuit. The image processor 10 subjects the first electrical signals read from the first opto-electrical conversion parts 113 to gain adjustment processing, noise elimination processing, A/D conversion, and various other kinds of processing to produce first image data. Furthermore, the image processor 10 subjects the first image data to Lab conversion to produce an L component signal as a brightness signal. The L component signal is produced for each pixel of the first imaging element 110, so the L component signal is also image data. That is, the L component signal expresses a brightness component image constituted by a brightness signal.

The image processor 10 outputs the L component signal produced from the first image data to the captured image data production unit 20 (discussed below). Also, the image processor 10 outputs the first image data to the contrast detector 50 (discussed below).

The image processor 10 subjects the second electrical signal produced by the second imaging element 120 to specific processing to produce second image data. Also, the image processor 10 produces ab component signals (that is, an a-component signal and a b-component signal) from the second image data.

More specifically, the image processor 10 reads the second electrical signal produced by the second opto-electrical conversion parts 127 via the second circuit part 125 and the peripheral circuit. The image processor 10 subjects the second electrical signal read from the second opto-electrical conversion parts 127 to gain adjustment processing, noise elimination processing, A/D conversion, and various other kinds of processing to produce second image data. Furthermore, the image processor 10 subjects the second image data to Lab conversion, and produces ab component signals (that is, an a-component signal and a b-component signal) as color component signals.

The image processor 10 produces an a-component signal and a b-component signal for each of the second opto-electrical conversion parts 127. Also, the image processor 10 produces second image data based on the second electrical signals which express colors (that is, red, blue, or green) according to the colors of the corresponding color filters 130, and produces ab component signals by excluding the brightness component from the second image data. That is, the ab component signals are also image data, and express color component images made up of color component signals.

The image processor 10 outputs the a-component signals and b-component signals to the captured image data production unit 20 (discussed below). Also, the image processor 10 outputs the second image data to the identifier 40 (discussed below).

The captured image data production unit 20 acquires L component signals and ab component signals from the image processor 10, and produces captured image data representing a captured image by synthesizing the L component signals and ab component signals. The imaging device 1 then stores the captured image data produced by the captured image data production unit 20 in a momory unit (not shown) of the imaging device 1. Also, the imaging device 1 displays the captured image data produced by the captured image data production unit 20 on a display unit (not shown) of the imaging device 1.

The identifier 40 performs detection of facial regions, using as its input a characteristic amount (an example of basic information) that characterizes a facial region and the second image data produced by the image processor 10. The characteristic amounts that characterize a facial region are preferably stored ahead of time in a ROM or other such memory device (not shown) provided to the imaging device 1.

The identifier 40 identifies a specific facial region from the second image data produced by the image processor 10, by referring to identification information (an example of basic information). The term "identify" here means detecting a certain region of a subject within an image, such as detecting a specific facial region. The "identification information" is information that characterizes a certain region to be identified out of an image, such as color information characteristic of the facial region of a certain person. In this embodiment, the identifier 40 detects a specific facial region (an example of a specific characteristic region; hereinafter referred to specific facial region) on the basis of color information serving as the identification information.

The identifier 40 extracts color information that characterizes a detected facial region (hereinafter referred to as detected color information). Furthermore, the identifier 40 compares the detected color information to the identification information and determines whether or not the detected facial region coincides with the specific facial region. The identification information that characterizes the specific facial region is preferably stored ahead of time in a ROM or other such memory device (not shown) provided to the imaging device 1.

Furthermore, the identifier 40 detects information expressing the position and size of the specific facial region (hereinafter referred to as region designating information) within the image represented by the second image data. When focus control (discussed below) is carried out on the specific facial region, the region designating information is suitably read by the contrast detector 50, and focus control is performed on the basis of the region designating information.

The contrast detector 50 (an example of an evaluation value detector) acquires first image data from the image processor 10 and detects a contrast value (an example of an evaluation value) on the basis of the acquired first image data. The contrast detector 50 outputs the detected contrast value to the focus lens drive amount calculator 60. The contrast detector 50 acquires region designating information about a specific facial region from the identifier 40, and can detect a contrast value from the first image data corresponding to the pixels present in a specific facial region.

The focus lens drive amount calculator 60 calculates the direction in which the focus lens L1 is moved (driven) and the drive amount on the basis of lens position information indicating the position of the focus lens L1 and the contrast value calculated by the contrast detector 50. The focus lens drive amount calculator 60 outputs information about the calculated direction in which the focus lens L1 is driven and the drive amount to the focus lens driver 70.

The focus lens driver 70 has an actuator, and drives the focus lens L1. More specifically, the focus lens driver 70 moves the focus lens L1 by the drive amount calculated by the focus lens drive amount calculator 60, in the direction calculated by the focus lens drive amount calculator 60.

The focus lens driver 70 has a position sensor (not shown) for detecting the position of the focus lens L1. The focus lens driver 70 outputs information expressing the position of the focus lens L1 detected by the position sensor (hereinafter referred to as lens position information) to the focus lens drive amount calculator 60.

1.2: Operation 1.2.1: Opto-Electrical Conversion by Composite Imaging Element

The light that is incident on the composite imaging element 100 will be described through reference to the drawings. In FIG. 2, an example of the optical path of the light incident on the first opto-electrical conversion parts 113 and parallel to the optical axis AZ direction is indicated by a one-dot chain line. The broken lines in FIG. 2 are examples of the optical path of the light collected at the second light receiving face 126a.

The light that is incident on the composite imaging element 100 from the optical system L is incident on the reinforcing glass 111 provided to the first imaging element 110. The light that has passed through the reinforcing glass 111 reaches the first semiconductor layer 112 (more precisely, the first light receiving face 112a).

Here, no micro-lens is installed in the first imaging element 110. With an imaging element in which color filters are disposed, it is possible that light that has passed through the color filters will be incident on the adjacent opto-electrical conversion parts, resulting in color mixing. In view of this, with an imaging element in which color filters are provided, a micro-lens for light collection is disposed in order to prevent color mixing.

However, with an imaging element in which a micro-lens is provided, a transparent protective film (such as a silicon dioxide film) is often formed between the micro-lens and the semiconductor layer in which the opto-electrical conversion parts are formed. With an imaging element such as this, if light that has passed through the micro-lens reaches the protective film, there is the possibility that the light will go through the protective film and be incident on the adjacent opto-electrical conversion parts, resulting in color mixing. Also, when a micro-lens is provided, the incidence angle of the incident light with respect to the micro-lens must be within a suitable range in order for the light to be collected by the micro-lens.

On the other hand, with the first imaging element 110 according to this embodiment, since the color filters are eliminated, no color mixing occurs. Accordingly, the micro-lens is eliminated, and the light incident on the first imaging element 110 can be incident on the first opto-electrical conversion parts 113 without going through the micro-lens first. Therefore, as far as the light incident on the first imaging element 110 from the optical system L is concerned, the permissible range for the incidence angle with respect to the first opto-electrical conversion parts 113 (more precisely, the first light receiving face 112a) is much wider than when a micro-lens is installed. As a result, with the imaging device 1, there is greater latitude in designing the optical system L than when a micro-lens is provided to the first imaging element 110. Greater latitude in optical design affords a smaller optical system L and a lower cost.

The light that reaches the first light receiving face 112a is also incident on the first opto-electrical conversion parts 113. Part of the light incident on the first opto-electrical conversion parts 113 generates an opto-electrical effect at the first opto-electrical conversion parts 113. As a result, first electrical signals are produced by the first opto-electrical conversion parts 113 according to the intensity of the incident light. Since no color filters are installed in the first imaging element 110, light including two or more of the three primary colors can be incident on the first opto-electrical conversion parts 113. Therefore, light of a wavelength band corresponding to the three primary colors can generate an opto-electrical effect at the first opto-electrical conversion parts 113, so the strength of the first electrical signals produced by the first opto-electrical conversion parts 113 is much higher than when color filters are used.

Part of the light incident on the first opto-electrical conversion parts 113 passes through the first opto-electrical conversion parts 113 and is incident on the first insulating layer 115. A part of the light that passes through the first opto-electrical conversion parts 113 is reflected by the first mask 117 and is again incident on the first opto-electrical conversion parts 113 from the first insulating layer 115 side. Thus, because the first mask 117 is provided, the light utilization efficiency is improved at the first opto-electrical conversion parts 113.

Part of the light incident on the first insulating layer 115 from the first opto-electrical conversion parts 113 goes through the first openings 117a provided to the first mask 117, and comes out of the first imaging element 110.

Part of the light that comes out of the first opto-electrical conversion parts 113 passes through the adhesive layer 140 and is incident on the second imaging element 120. The light incident on the second imaging element 120 is incident on the convex surface of the micro-lens 121 (more precisely, the lens elements 121a) and collected by the micro-lens 121. The refractive index of the micro-lens 121 is greater than the refractive index of the adhesive layer 140, so a light collecting effect by the micro-lens 121 is obtained.

As indicated by the broken lines in FIG. 2, the light collected by the optical system L is focused on the first light receiving face 112a formed by the first opto-electrical conversion parts 113. Therefore, light that has passed through the first opto-electrical conversion parts 113 is scattered again as it moves toward the second imaging element 120 side. If light that has passed through the first opto-electrical conversion parts 113 continues to be scattered, it will be difficult for the light to be incident on the desired second opto-electrical conversion parts 127 of the second imaging element 120. Also, scattered light tends to be eclipsed (that is, tends to be blocked) by the second mask 124. If light is blocked by the second mask 124, less light will be incident on the second opto-electrical conversion parts 127, and the sensitivity of the second imaging element 120 will end up being lower.

In contrast, since the micro-lens 121 is provided to the second imaging element 120, light scattered from the first opto-electrical conversion parts 113 is collected again on the second opto-electrical conversion parts 127 by the micro-lens 121. As a result, light that has passed through the first opto-electrical conversion parts 113 goes through the second openings 124a and can be incident on the second opto-electrical conversion parts 127 disposed at corresponding positions. More specifically, light that has passed through the first opto-electrical conversion parts 113 is substantially collected on the second opto-electrical conversion parts 127 disposed at positions that overlap these first opto-electrical conversion parts 113 when viewed in the optical axis AZ direction.

Furthermore, since the second imaging element 120 is a front illumination type of imaging element, the color filter layer 122 and the second insulating layer 123 are disposed between the micro-lens 121 and the second opto-electrical conversion parts 127. Therefore, the distance necessary for the micro-lens 121 to collect light on the second opto-electrical conversion parts 127 is ensured between the micro-lens 121 and the second opto-electrical conversion parts 127.

Also, since the second circuit part 125 and the second mask 124 are formed at the second insulating layer 123, the leakage of light to adjacent second opto-electrical conversion parts 127 can be suppressed. Thus, with the composite imaging element 100, color mixing is suppressed by using a front illumination type of imaging element as the second imaging element 120.

The light collected by the micro-lens 121 reaches the color filters 130. The light undergoes wavelength band conversion at the color filters 130. That is, the light that has passed through the color filters 130 is converted into light with a wavelength band corresponding to the color of red, blue, or green, according to which of the first filters 130a to third filters 130c the color filters 130 are.

Light that has passed through the color filters 130 is incident on the second insulating layer 123. Light incident on the second insulating layer 123 passes between the second circuit parts 125, and then goes through the second openings 124a provided to the second mask 124, and reaches the second semiconductor layer 126 (more precisely, the second light receiving face 126a).

The light that has reached the second semiconductor layer 126 is incident on the second opto-electrical conversion parts 127. The light incident on the second opto-electrical conversion parts 127 generates an opto-electrical effect. As a result, second electrical signals are produced by the second opto-electrical conversion parts 127 according to the intensity of the incident light.

Since the second opto-electrical conversion parts 127 are larger in size than the first opto-electrical conversion parts 113, the sensitivity of the second opto-electrical conversion parts 127 is improved. That is, because the size of the second opto-electrical conversion parts 127 is about four times the size of the first opto-electrical conversion parts 113, more light is received by the second opto-electrical conversion parts 127 than when the size of the second opto-electrical conversion parts 127 is about the same as the size of the first opto-electrical conversion parts 113. The term "size" here means the surface area when viewed in the optical axis AZ direction.

Here, when visible light passes through a transparent medium, light of a shorter wavelength is generally attenuated more. For example, the attenuation effect that light with a wavelength band corresponding to blue undergoes when passing through the first imaging element 110 is greater than the attenuation effect that light with a wavelength band corresponding to red or green undergoes. Therefore, if the color filters 130 have what is known as an RGGB Bayer arrangement, there is the possibility that the second imaging element 120 will not have enough sensitivity to blue light. If blue light cannot undergo opto-electrical conversion with good precision, there is the risk that the color reproduction of blue will decrease in the captured image.

In contrast, the color filters 130 provided to the second imaging element 120 are arranged in an RGBB pattern, so with the second imaging element 120, blue light that is prone to attenuation in passing through the first imaging element 110 is received more efficiently than light of other colors. As a result, the second opto-electrical conversion parts 127 can subject blue light to opto-electrical conversion efficiently, so the color reproduction in the captured image is better than when using color filters having an RGGB Bayer arrangement.

As discussed above, the second opto-electrical conversion parts 127 are larger than the first opto-electrical conversion parts 113. Also, the second imaging element 120 is provided with the micro-lens 121 that collects light on the second opto-electrical conversion parts 127, and with the color filters 130 that have an RGBB arrangement. Accordingly, even if blue light is attenuated as it passes through the first imaging element 110, more information about the blue component can be taken in by the second imaging element 120.

1.2.2: Image Acquisition

As discussed above, light collected by the optical system L is incident on the first opto-electrical conversion parts 113 and converted into first electrical signals. Light that passes through the first imaging element 110 and is incident on the second opto-electrical conversion parts 127 is then converted into second electrical signals by the second opto-electrical conversion parts 127.

The first electrical signals produced by the first opto-electrical conversion parts 113 is read to the image processor 10 through the first circuit part 116 and the peripheral circuit. The second electrical signals produced by the second opto-electrical conversion parts 127 are read to the image processor 10 through the second circuit part 125 and the peripheral circuit.

Lab Conversion

The image processor 10 produces first image data on the basis of the first electrical signals inputted from the first imaging element 110, and then produces L component signals for the Lab color space from the first image data. If an auto-focus function (discussed below) is performed by the imaging device 1, then focus control is performed so that the focus is on the first light receiving face 112a of the first imaging element 110. Therefore, the first electrical signals acquired by the first imaging element 110 are precise brightness signals that match the focal point.

Furthermore, since no color filters are provided to the first imaging element 110, the first electrical signal obtained form the first imaging element 110 is suited to producing an L component signal. That is, since no color filters are provided to the first imaging element 110, light of a plurality of basic colors can be incident on the first opto-electrical conversion parts 113. As a result, more light is incident on the first opto-electrical conversion parts 113 than when color filters are provided, and a more precise brightness signal can be obtained. Thus, the L component signal produced from the first electrical signal by the image processor 10 is a very precise signal (that is, it is a signal with high contrast and a high S/N ratio). Incidentally, the L component signal was produced by Lab conversion of first image data, but the first image data may instead be used directly as the L component signal.

Also, second image data is produced by the image processor 10 on the basis of a second electrical signal inputted from the second imaging element 120, and ab component signals (that is, an a-component signal and a b-component signal) for the Lab color space are produced on the basis of the second image data.

As mentioned above, the number of pixels of the first imaging element 110 is four times the number of pixels of the second imaging element 120. Therefore, the number of pixels of a brightness component image produced from the first electrical signal acquired by the first imaging element 110 will be four times the number of pixels of the color component image produced from the second electrical signal acquired by the second imaging element 120. Thus, the resolution of the color component image is lower than the resolution of the brightness component image.

Also, with the imaging device 1, since focus control is performed so that the focal point is on the first light receiving face 112a of the first imaging element 110, the second light receiving face 126a of the second imaging element 120 is at a different position from the focal position. Thus, with the second imaging element 120, the second electrical signal is acquired in an unfocused state, and an ab component signal is produced from this second electrical signal.

Since the ab component signal here is a signal having only color component information, there is no need for high precision in terms of visual characteristics. The ability of a person to recognize color component information is considerably lower than the ability to recognize brightness information. Therefore, even though a color component signal with somewhat inferior precision is used, a color image good enough to pose no problem can be produced by combining with a highly precise brightness signal. A "color image good enough to pose no problem" is an image recognized by a person to be a color image of high resolution.

Production of Captured Image Data

The L component signal and ab component signal produced by the image processor 10 are inputted to the captured image data production unit 20. The L component signal and the ab component signal are combined at the captured image data production unit 20 to produce captured image data. Since the captured image data is produced by combining a highly precise L component image with a slightly less precise ab component signal, the resulting precision will be good enough for the data of a synthesized image.

As above, with the imaging device 1, the number of pixels of the first imaging element 110 can be increased without lowering the sensitivity of the first imaging element 110 or the second imaging element 120, so a captured image that is of good quality and is a color image can be acquired.

1.2.3: Identification Processing

The imaging device 1 has a function of identifying a specific facial region. The processing by which a specific facial region is identified is begun, for example, when the user uses a mode switch (not shown) to put the identification function in its active state.

Figure 6:
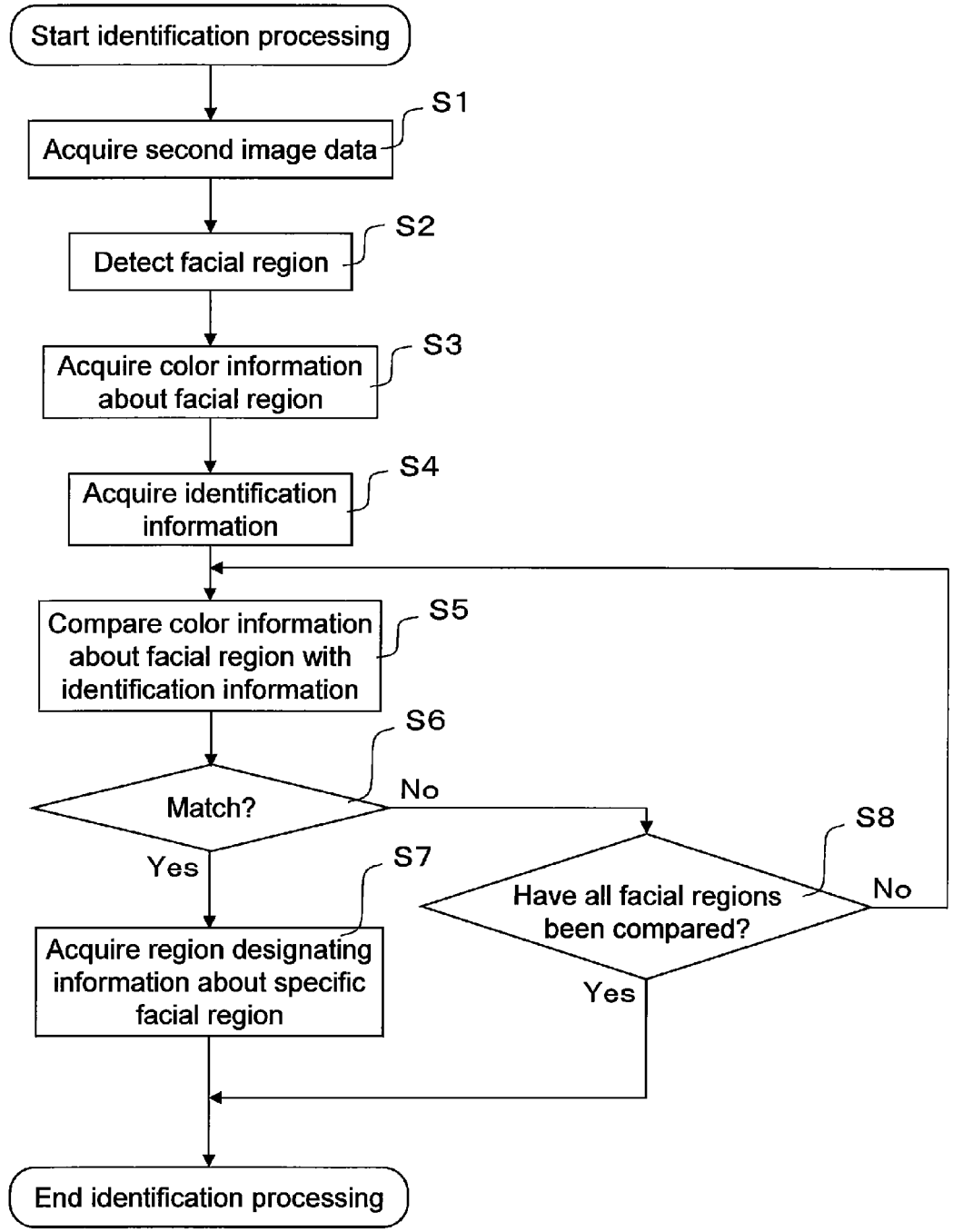
FIG. 6 is a flowchart of identification processing.

FIG. 6 is a flowchart of the identification processing procedure. This identification processing will now be described through reference to FIG. 6.

When the identification function is activated, the flow moves to step S1. In step S1, the identifier 40 acquires second image data from the image processor 10.

In step S2, the identifier 40 detects a facial region from an image expressed by the second image data. Here, the identifier 40 compares the second image data with a characteristic amount that characterizes the facial region of a person, and detects as a person's facial region the region in which there is a high similarity to the characteristic amount in the image expressed by the second image data. Information indicating the distinctive brightness of a person's face, or information indicating the color component of skin can be used, for example, as the characteristic amount that characterizes a person's facial region. There may also be a plurality of facial regions detected from the second image data (detected facial regions).

In step S3, the identifier 40 extracts detected color information that characterizes each detected facial region on the basis of the second image data. If a plurality of facial regions are detected, the identifier 40 extracts color information (detected color information) that characterizes each detected facial region from the second image data expressing each detected facial region.

In step S4, the identifier 40 acquires identification information. In this embodiment, "identification information" is color information that characterizes the facial region of a certain person (specific facial region).

In step S5, the identifier 40 compares the extracted detected color information with the identification information. More specifically, the identifier 40 calculates the similarity between the extracted detected color information and the identification information, and compares the detected color information with the identification information on the basis of this similarity.

In step S6, the identifier 40 determines whether or not the detected color information matches the identification information. More specifically, if the calculated similarity is greater than a specific threshold, the identifier 40 decides that the detected color information matches the identification information. If there is a match, the detected facial region selected by the identifier 40 at this point is decided to be a specific facial region (the one to be identified), and the flow proceeds to step S7. On the other hand, if the detected color information does not match the identification information, the flow proceeds to step S8.

In step S7, the identifier 40 acquires region designating information that expresses the position and size of the specific facial region within the image expressed by the second image data. After acquiring the region designating information, the identifier 40 ends the identification processing.

In step S8, the identifier 40 determines whether or not all of the detected facial regions have been compared with the identification information. If all of the detected facial regions have been compared with the identification information, it is decided that the specific facial region is not in the image, and the identification processing ends. If there is a detected facial region that has not been compared with the identification information, the flow proceeds to step S5. When the processing has gone from step S7 to step S5, a detected facial region that has not yet been compared with the identification information is selected by the identifier 40, and the processing of steps S5 to S7, or steps S5 to S8, is executed again.

The processing for identifying the facial region of a certain person (specific facial region) is executed as above.

1.2.4: Auto-Focus

The imaging device 1 has an auto-focus function. The focus control performed by the imaging device 1 is what is known as a contrast detection method. The auto-focus function involves, for example, pressing a release button (not shown) half-way down to activate the function. Once the auto-focus function has been activated, focus control is started by the imaging device 1.

In the focus control of the imaging device 1, the contrast detector 50 detects a contrast value on the basis of the first image data inputted from the image processor 10. Here, the contrast value is an example of an evaluation value for evaluating how well the image is in focus. An L component signal produced from the first image data by the image processor 10 may be inputted to the contrast detector 50 instead of the first image data. In this case, the contrast detector 50 detects the contrast value on the basis of the L component signal.

The focus lens drive amount calculator 60 decides the drive amount by which the focus lens L1 is to be moved, and the direction in which the focus lens L1 is to be driven, so that the optical image formed by the optical system L will be focused on the first light receiving face 112*a*, using the contrast value detected by the contrast detector 50 as the input.

The focus lens driver 70 moves the focus lens L1 by the drive amount calculated by the focus lens drive amount calculator 60, in the direction decided by the focus lens drive amount calculator 60. Furthermore, the focus lens driver 70 detects the position of the focus lens L1, and outputs lens position information expressing the position of the focus lens L1 to the focus lens drive amount calculator 60.

The focus lens drive amount calculator 60 determines whether or not a focused state has been obtained on the basis of the contrast value inputted from the contrast detector 50. If a focused state has been obtained, the focus lens drive amount calculator 60 ends focus control. If a focused state has not been obtained, the focus lens drive amount calculator 60 continues focus control. More specifically, the focus lens drive amount calculator 60 newly decides the drive amount by which the focus lens L1 is to be moved, and the direction in which the focus lens L1 is to be driven, on the basis of the contrast value inputted from the contrast detector 50 and the lens position information inputted from the focus lens driver 70.

Focus control is accomplished by what is known as wobbling, for example. With a wobbling method, a change in the contrast value is detected in time series by moving the focus lens by a tiny vibration (wobble). The focus lens here is driven in the direction in which the contrast value rises.

Focus control may also be accomplished by video AF (automatic focusing). With a video AF method, the peak contrast value is detected by detecting the contrast value while driving the focus lens. That is, the peak contrast value is detected by driving the focus lens so as to temporarily go past the focal position. The contrast value reaches its peak when the focus lens is in the focal position, so a focused state is achieved by returning the focus lens to its position at the peak value.

The contrast detector 50 here may calculate the contrast value by using just part of the first image data. For instance, the sum of signal values acquired from a specific number of pixels within the image expressed by the first image data (the pixels present in a specific region) can be used as an evaluation value. More specifically, the contrast detector 50 reads from the identifier 40 the region designating information expressing the position and size of the specific facial region acquired by the identifier 40, and designates the first image data corresponding to the specific facial region on the basis of specific designating information and the first image data. Thus, the contrast detector 50 can detect the contrast value from the first image data corresponding to the specific facial region identified by the identifier 40.

As mentioned above, the first opto-electrical conversion parts 113 and the second opto-electrical conversion parts 127 are arranged in a state of being associated with each other, so the contrast detector 50 can associate the region in the image expressed by the first image data with the region in the image expressed by the second image data.

If the contrast detector 50 detects a contrast value on the basis of first image data corresponding to a specific facial region, a state in which the focus is on the specific facial region is maintained by executing the above-mentioned focus control. In other words, the position of the specific facial region is tracked within the captured image by the identifier 40, and focus control is executed on the specific facial region that is being tracked.

As discussed above, with the imaging device 1, first image data is produced from the first electrical signal acquired by the first imaging element 110, and focus control is executed on the basis of the first image data. Meanwhile, with the imaging device 1, second image data is produced from the second electrical signal acquired by the second imaging element 120, and tracking of the specific facial region is executed on the basis of the second image data.

Thus carrying out focus control and tracking in parallel allows for better precision in focus control of what is being identified (that is, what is being tracked). For example, if focus control is executed on the basis of the region designating information acquired by the identifier 40 on the condition that what is being identified is detected at high precision, focus control can be executed more reliably on what is being identified.

1.2.5: Imaging Processing

The imaging processing performed by the imaging device 1 will now be described. A situation will be described in which focus control is executed on the specific facial region detected by the identifier 40. Also, a case in which a still picture is captured by the imaging device 1 will be used as an example.

The user presses a release button provided to the imaging device 1 to carry out imaging with the imaging device 1. When the user operates the power switch (not shown) provided to the imaging device 1 to put the device in its on state, the imaging device 1 enters a standby state in which it is able to accept release button operation.

In standby state, the imaging device 1 determines whether or not the identification function has been set to its active state with the mode switch. If the identification function has been set to its active state, the imaging device 1 acquires first image data and second image data. Further, a specific facial region is identified by the identifier 40 on the basis of the acquired second image data. If the identification function is activated, the imaging device 1 repeatedly executes the acquisition of first image data and second image data and identification processing.

Also, in standby state, the imaging device 1 determines whether or not the release button has been pushed half-way down. If the release button has been pushed half-way down, the auto-focus function is activated, so the above-mentioned focus control is executed. That is, the contrast detector 50 acquires region designating information about the specific facial region from the identifier 40, and a contrast value is detected on the basis of the acquired region designating information and the first image data inputted from the image processor 10. Furthermore, the focus lens L1 is driven so as to put the focus on the specific facial region on the basis of the detected contrast value.

Here, the identification processing and the focus control may be executed alternately or in parallel. If the identification processing and the focus control are executed in parallel, the region designating information detected by the identifier 40 is suitably read out by the contrast detector 50. The contrast detector 50 calculates a contrast value for the specific facial region on the basis of the region designating information that has been read out.

Focus control is repeatedly executed for the specific facial region, and when one iteration of focus control ends, it is determined whether or not the release button has been pushed all the way down. If the release button has been pushed all the way down, a shutter (not shown) disposed between the optical system L and the composite imaging element 100 is controlled so as to execute the exposure of the composite imaging element 100. That is, when the shutter is opened, the light collected by the optical system L passes through the shutter and is incident on the composite imaging element 100. The light collected by the optical system L is converted into a first electrical signal and second electrical signal by the composite imaging element 100.

The first electrical signal and second electrical signal obtained by exposure of the composite imaging element 100 are converted into an L component signal and an ab component signal by the image processor 10. The captured image data production unit 20 produces captured image data from the L component signal and ab component signal inputted from the image processor 10. The imaging device 1 stores the captured image data produced by the captured image data production unit 20 in a memory unit (not shown) of the imaging device 1. Also, the imaging device 1 displays the captured image data produced by the captured image data production unit 20 on a display unit (not shown) of the imaging device 1.

The imaging operation is executed as above.

1.3: Effect

The effects of the composite imaging element 100 and the imaging device 1 according to this embodiment are compiled below.

(1) With this composite imaging element 100, the first opto-electrical conversion parts 113 is able to receive light that includes a first basic color and a second basic color, so compared to when only light of one basic color is incident on the first opto-electrical conversion parts 113, the strength of the electrical signals obtained by the first opto-electrical conversion parts 113 is increased and the sensitivity of the first imaging element 110 is improved.

Since the second circuit part 125 overlaps the first circuit part 116 when viewed in the optical axis AZ direction, the second opto-electrical conversion parts 127 can be disposed at positions corresponding to the first opto-electrical conversion parts 113. As a result, incident light that has passed through the first opto-electrical conversion parts 113 is more easily incident on the second opto-electrical conversion parts 127, so the incident light is efficiently subjected to opto-electrical conversion, and the sensitivity of the second imaging element 120 is improved.

Because the sensitivity of the first imaging element 110 and the second imaging element 120 is thus improved, the sensitivity of the composite imaging element 100 is also improved.

(2) With this composite imaging element 100, since the color filters 130 is disposed between the first opto-electrical conversion parts 113 and the second opto-electrical conversion parts 127, a color component signal can be acquired from the second electrical signals produced by the second opto-electrical conversion parts 127. That is, it is not necessary for the first opto-electrical conversion parts 113 to acquire a color component signal for producing a color image, so the color filters can be omitted from the first imaging element 110. As a result, more light is incident on the first opto-electrical conversion parts 113, so the sensitivity of the first imaging element 110 is improved, and the composite imaging element 100 is likewise improved.

(3) With this composite imaging element 100, since the first imaging element 110 is a back illumination type of imaging element, the sensitivity of the first imaging element 110 can be improved over that when the first imaging element 110 is a front illumination type of imaging element.

Also, since the second imaging element 120 is a front illumination type of imaging element, light that is incident on the second imaging element 120 is readily focused on the second opto-electrical conversion parts 127. Therefore, there is less leakage of light to the adjacent second opto-electrical conversion parts 127. In particular, color mixing can be prevented even when the color filters 130 are provided to the second imaging element 120.

Thus, using the composite imaging element 100 yields higher sensitivity and prevents color mixing.

(4) With this composite imaging element 100, since the micro-lens 121 is provided between the first opto-electrical conversion parts 113 and the second opto-electrical conversion parts 127, light that is incident on the second imaging element 120 is focused on the second opto-electrical conversion parts 127 by the micro-lens 121. Thus, there less leakage of light to the adjacent second opto-electrical conversion parts 127, so color mixing can be prevented even when the color filters 130 are provided to the second imaging element 120.

(5) With this composite imaging element 100, the number of third filters 130c that transmit blue light on the short wavelength side is greater than the number of first filters 130a that transmit red light and the number of second filters 130b that transmit green light. Therefore, more blue light can be transmitted through the color filters 130 than when the number of third filters 130c is equal to the number of first filters 130a or the number of second filters 130b, or when the number of third filters 130c is less than the number of first filters 130a or the number of second filters 130b.

As a result, even if blue light on the short wavelength side is attenuated while passing through the first imaging element 110, the amount of blue light that is incident on the second opto-electrical conversion parts 127 can be maintained. Thus, with the composite imaging element 100, the sensitivity of the second imaging element 120 with respect to light on the short wavelength side is higher, and this improves color reproducibility.

(6) With this imaging device 1, captured image data is produced by the captured image data production unit 20 on the basis of the L component signal produced on the basis of the first electrical signal by the image processor 10, and the ab component signal produced on the basis of the second electrical signal by the image processor 10. Therefore, the L component signal and the ab component signal complement each other, and captured image data can be produced that has high precision and is for a color image.

(7) With this imaging device 1, the identifier 40 identifies the specific facial region characterized by specific basic information (that is, the characteristic amount and identification information) on the basis of the second image data and the basic information. Also, the contrast detector 50 detects the contrast value used for focus control on the basis of the first image data that corresponds to the specific facial region.

Therefore, focus control can be executed in parallel with the identification processing of the specific facial region, and whether or not to execute focus control can be decided according to whether the specific facial region has been successfully identified, so focus control over the specific facial region can be executed properly.

(8) With this composite imaging element 100, the second opto-electrical conversion parts 127 are disposed at a second pitch that is greater than the first pitch at which the first opto-electrical conversion parts 113 are disposed, so the size of the second opto-electrical conversion parts 127 can be larger than the size of the first opto-electrical conversion parts 113.

Expanding the size of the second opto-electrical conversion parts 127 allows the efficiency of the opto-electrical conversion at the second opto-electrical conversion parts 127 to be raised, so the sensitivity is improved, as is the sensitivity of the composite imaging element 100.

In particular, the second imaging element 120 can efficiently receive light that has passed through the color filters 130, and can acquire a color component signal of high sensitivity, so color reproducibility is improved.

(9) With this composite imaging element 100, the second imaging element 120 is a front illumination type of imaging element, so there is less leakage of light between adjacent second opto-electrical conversion parts 127. As a result, a captured image with little color mixing can be acquired by using this composite imaging element 100 for imaging.

Other Embodiments

The specific constitution of the composite imaging element and identification disclosed herein is not limited to or by the above embodiment, and various modifications and changes are possible without departing from the gist of the invention.

(A) In the above embodiment, the first imaging element 110 was a CMOS type of image sensor, but the first imaging element 110 may instead be some other image sensor, such as a CCD type of image sensor.

Also, in the above embodiment, the second imaging element 120 was a CCD type of image sensor, but the second imaging element 120 may instead be some other image sensor, such as a CMOS type of image sensor.

When a CCD image sensor is used as the first imaging element 110, a vertical register, a charge transmission path, or another such circuit is provided to the first circuit part 116. When a CMOS image sensor is used as the second imaging element 120, a signal line, a transistor, or another such circuit is provided to the second circuit part 125.

(B) In the above embodiment, the light that can be incident on the first opto-electrical conversion parts 113 was light including a plurality of basic colors of light out of the three primary colors (namely, red, green, and blue), but a light color other than the three primary colors may be used as the basic color expressing the color of light. The basic color may be a combination of colors that can express the wavelength band included in visible light, so it may be the three primary colors expressed by complementary colors (namely, cyan, magenta, and yellow).

Similarly, in the above embodiment, primary color filters using the three primary colors of light were employed as the color filters 130, but the colors used for the color filters 130 may be something other than the three primary colors of light. For example, complementary color filters may be used as the color filters 130. Even if the color filters 130 are complementary color filters, at least a color component signal can be acquired from the second electrical signal produced by the second imaging element 120.

However, for light on the short wavelength side to be efficiently incident on the second opto-electrical conversion parts 127, it is preferable for the color filters to include a preponderance of blue filters so that enough light on the short wavelength side will be transmitted. Therefore, to acquire a captured image with good color reproducibility, it is preferable to use primary color filters as the color filters 130.

(C) In the above embodiment, the shape of the first opto-electrical conversion parts 113 and the second opto-electrical conversion parts 127 was square when viewed in the optical axis AZ direction, but the shape of the first opto-electrical conversion parts 113 and the second opto-electrical conversion parts 127 may instead be some other shape (such as a circular shape, or a polygonal shape other than a tetragon).

Also, in the above embodiment, the first opto-electrical conversion parts 113 and the second opto-electrical conversion parts 127 are arranged in the X axis direction and the Y axis direction, which are mutually perpendicular, but the arrangement directions do not necessarily have to be mutually perpendicular in a plane.

Furthermore, in the above embodiment, the second pitch was twice the first pitch, but the second pitch may be any integer multiple of the first pitch. As long as the second pitch is any integer multiple of the first pitch, the size of the second opto-electrical conversion parts 127 can be made larger than the size of the first opto-electrical conversion parts 113, so the sensitivity of the second imaging element 120 can be enhanced.

(D) In the above embodiment, the first mask 117 was provided, but if adequate sensitivity can be obtained with the first imaging element 110 without having the first mask 117 reflect light, then the first mask 117 may be omitted. Even if the first mask 117 is omitted, an adequate amount of light will be incident on the second opto-electrical conversion parts 127, so at least the sensitivity of the second imaging element 120 can be improved.

Also, in the above embodiment, the second mask 124 was provided, but if only the light utilization efficiency is taken into account, then the second mask 124 may be omitted. However, it is preferable to provided the second mask 124 in order to suppress color mixing.

(E) In the above embodiment, the first imaging element 110 had the reinforcing glass 111, but a member other than reinforcing glass may be provided as the member disposed on the first light receiving face (or surface) 112a side of the first semiconductor layer 112. If the goal is for light including two or more basic colors to be incident on the first opto-electrical conversion parts 113, the member disposed on the first light receiving face 112a side of the first semiconductor layer 112 may be transparent to visible light. Therefore, even when using a member other than the reinforcing glass 111, the sensitivity of the first imaging element 110 can be improved. For example, the reinforcing glass 111 may be omitted if a protective film of silicon dioxide is formed on the first light receiving face 112a side of the first semiconductor layer 112, and the entire composite imaging element 100 is protected by a package, for example.

(F) In the above embodiment, an adhesive agent was used as the medium that filled the space between the micro-lens 121 and the first imaging element 110, but if the refractive index of the medium is lower than the refractive index of the micro-lens 121, a medium other than an adhesive agent may be used. For instance, an air layer may be provided instead of the adhesive layer 140. However, since the first imaging element 110 and the second imaging element 120 need to be fixed to each other in a state in which their positions are aligned, providing the adhesive layer 140 is preferable.

Also, in the above embodiment, the micro-lens 121 was provided as a light collector for focusing light on the second opto-electrical conversion parts 127, but some other member may be used for the light collector. That is, as long as the light is focused on the second opto-electrical conversion parts 127, a medium that guides light may be disposed between the first insulating layer 115 and the color filter layer 122, and the refractive index of this medium may be continuously varied so that light is focused on the second opto-electrical conversion parts 127, for example.

(G) In the above embodiment, the image processor 10 produced an L component signal as a brightness signal, while an ab component signal was produced as a color component signal, but the brightness signal production unit that produces the brightness signal and the color component signal production unit that produces the color component signal may be provided separately. Similarly, the function unit that produces the first image data and the function unit that produces the second image data may be provided separately.

Also, with the identification described in the above embodiment, the processing of the various blocks may be realized by individual pieces of hardware, or the processing of a few different blocks may be executed by hardware. For example, if various programs are read into a microprocessor, the microprocessor may perform the processing of the various blocks of the identification.

(H) In the above embodiment, the characteristic region that was detected was a facial region, but the characteristic region may be something other than a facial region, as long as it is an image region that can be detected using the second image data based on the second electrical signal obtained from the second imaging element 120.

(I) In the above embodiment, a case in which the imaging device 1 acquired still pictures was described, but the imaging device 1 may have a function of acquiring moving pictures. That is, the imaging device 1 should be able to acquire a captured image with an imaging element, and the imaging device 1 need not be a digital camera, and may instead be a digital video camera, a digital still camera, or an electronic device such as a portable telephone capable of imaging.

General Interpretation of Terms

In understanding the scope of the present disclosure, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Also as used herein to describe the above embodiment(s), the following directional terms "forward", "rearward", "above", "downward", "vertical", "horizontal", "below" and "transverse" as well as any other similar directional terms refer to those directions of a composite imaging element and an imaging device equipped the composite imaging element. Accordingly, these terms, as utilized to describe the present invention should be interpreted relative to a composite imaging element and an imaging device equipped the composite imaging element.

The term "configured" as used herein to describe a component, section or part of a device includes hardware and/or software that is constructed and/or programmed to carry out the desired function.

The term "detect" as used herein to describe an operation or function carried out by a component, a section, a device or the like includes a component, a section, a device or the like that does not require physical detection, but rather includes determining, measuring, modeling, predicting or computing or the like to carry out the operation or function.

The terms of degree such as "substantially", "about" and "approximately" as used herein mean a reasonable amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A composite imaging element comprising:
    a first imaging element including a plurality of first opto-electrical conversion parts configured to receive light having a first basic color and a second basic color different from the first basic color, the first opto-electrical conversion parts being further configured to convert light received by the first opto-electrical conversion parts into a first electrical signal, a first light receiving surface formed by the opto-electrical conversion parts, a plurality of first separation regions provided between the first opto-electrical conversion parts, the plurality of first separation regions forming boundaries between adjacent the first opto-electrical conversion parts and a plurality of first circuit parts through which the first electrical signal is transmitted, the first circuit parts disposed at positions that overlap the first separation regions when viewed from a first direction, the first direction substantially perpendicular to the first light receiving surface; and
    a second imaging element including a plurality of second opto-electrical conversion parts configured to receive light emitted from the first opto-electrical conversion parts and convert light received by the second opto-electrical conversion parts into a second electrical signal, a plurality of second separation regions provided between the second opto-electrical conversion parts, the plurality of second separation regions forming boundaries between adjacent the second opto-electrical conversion parts and a plurality of second circuit parts disposed at positions that overlap the second separation regions when viewed from the first direction, the second electrical signal being transmitted through the second circuit part;
    wherein:
    the first opto-electrical conversion parts are disposed at a first pitch,
    the second opto-electrical conversion parts are disposed at a second pitch, the second pitch greater than the first pitch, and
    a portion of the first circuit parts are disposed at positions that do not overlap the second circuit parts when viewed from the first direction.

2. The composite imaging element according to claim 1, further comprising
    color filters disposed between the first opto-electrical conversion parts and the second opto-electrical conversion parts, the color filters configured to change the wavelength band of light.

3. The composite imaging element according to claim 2, wherein
    the color filters include first filters that transmit light of a first wavelength band, second filters that transmit light of a second wavelength band, and third filters that transmit light of a third wavelength band different from the first and second wavelength bands, the third wavelength band includes shorter wavelengths than the first and second wavelength bands, and
    the number of the third filters is greater than the number of the first and second filters.

4. The composite imaging element according to claim 3, wherein
    the third wavelength band represents blue.

5. The composite imaging element according to claim 3, wherein
    the color filters are arranged to form a repeating pattern, and the repeating pattern includes a pattern element that has one of the first filters, one of the second filters, and two of the third filters.

6. The composite imaging element according to claim 5, wherein
    the pattern element is rectangular, and
    the two third filters are disposed diagonal to one another within the rectangular pattern element.

7. The composite imaging element according to claim 1, wherein
    the first imaging element is a back illumination type of imaging element.

8. The composite imaging element according to claim 7, wherein
    the second imaging element is a front illumination type of imaging element.

9. The composite imaging element according to claim 8, wherein
    the first imaging element includes a first semiconductor layer and a first insulating layer, the first semiconductor layer having the first opto-electrical conversion parts and the first separation regions, the first insulating layer having the first circuit parts and formed on the opposite side of the first semiconductor layer from the first light receiving surface, and the second imaging element includes a second semiconductor layer and a second insulating layer, the second semiconductor layer having the second opto-electrical conversion parts and the second separation regions, the second insulating layer having the second circuit parts and disposed between the second semiconductor layer and the first semiconductor layer.

10. The composite imaging element according to claim 9, wherein the first insulating layer has first masks are formed so as to cover the opposite side of the first circuit parts from the second semiconductor layer, and the second insulating layer has second masks formed so as to cover the opposite side of the second circuit parts from the second semiconductor layer.

11. The composite imaging element according to claim 1, further comprising a light collector disposed between the first opto-electrical conversion parts and the second opto-electrical conversion parts, the light collector focusing light on the second opto-electrical conversion parts.

12. An imaging device comprising:

an optical system that collects light from a subject and forms an optical image of the subject; and the composite imaging element according to claim 1 configured to receive light collected by the optical system.

13. The imaging device according to claim 12, further comprising a first signal acquisition unit configured to produce a brightness signal for the optical image based on the first electrical signal;

a second signal acquisition unit configured to produce a color component signal for the optical image based on the second electrical signal; and a captured image data production unit configured to produce captured image data expressing an image of the subject based on the brightness signal and the color component signal.

14. The imaging device according to claim 12, further comprising an image processor configured to produce first image data from the first electrical signal and produce second image data from the second electrical signal;

an identifier configured to identify a specific characteristic region within an image of the subject, the specific characteristic region being defined by specific basic information and the image of the subject being defined by the second image data; and an evaluation value detector configured to detect an evaluation value used for focus control based on the first image data conesponding to the specific characteristic region.

* * * * *